United States Patent
Lee (10) Patent No.: US 9,741,408 B2
(45) Date of Patent: Aug. 22, 2017

(54) SEMICONDUCTOR MEMORY DEVICE HAVING DUMMY WORD LINES AND OPERATING METHOD THEREOF

(71) Applicant: SK hynix Inc., Gyeonggi-do (KR)

(72) Inventor: Yeonghun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/924,523

(22) Filed: Oct. 27, 2015

(65) Prior Publication Data
US 2016/0284389 A1 Sep. 29, 2016

(30) Foreign Application Priority Data

Mar. 27, 2015 (KR) .................. 10-2015-0043627

(51) Int. Cl.
*G11C 7/00* (2006.01)
*G11C 8/08* (2006.01)
(Continued)

(52) U.S. Cl.
CPC .................. *G11C 8/08* (2013.01); *G11C 7/14* (2013.01); *G11C 8/10* (2013.01); *G11C 16/0483* (2013.01); *G11C 16/10* (2013.01); *G11C 16/3427* (2013.01)

(58) Field of Classification Search
CPC . G11C 16/0483; G11C 16/10; G11C 16/3427; G11C 8/10; G11C 8/08; G11C 5/14
(Continued)

(56) References Cited

U.S. PATENT DOCUMENTS 8,619,493 B2 * 12/2013 Kim ................. G11C 7/1045
365/185.11
8,730,738 B2 * 5/2014 Oh .................. G11C 16/10
365/185.17
(Continued)

FOREIGN PATENT DOCUMENTS

KR 1020130118033 10/2013

OTHER PUBLICATIONS

Yoo, H, et al., Modeling and Optimization of the Chip Level Program Disturbance of 3D NAND Flash Memory, 2013 5th IEEE International Memory Workshop (IMW), May 26-29, 2013, pp. 147-150.

*Primary Examiner* — David Lam
(74) *Attorney, Agent, or Firm* — IP & T Group LLP (57) ABSTRACT

A semiconductor memory device includes a memory cell array, and a voltage generator suitable for generating voltages supplied to the memory cell array. The memory cell array includes cell strings each including memory cells extending in a first direction and arranged in a second direction and a third direction; bit lines extending in the second direction and electrically coupled to the cell strings; and word lines extending in the third direction and electrically coupled to corresponding memory cells, wherein the word lines includes dummy word lines. A program voltage is supplied to a program word line that is electrically coupled to a memory cell to be programmed, and a level of a first dummy word line voltage supplied to a parallel dummy word line, which is disposed parallel to the program word line in the first direction is different from a level of a second dummy voltage supplied to a nonparallel dummy word line other than the parallel dummy word line.

12 Claims, 4 Drawing Sheets

(51) Int. Cl.
    *G11C 7/14*        (2006.01)
    *G11C 8/10*        (2006.01)
    *G11C 16/04*       (2006.01)
    *G11C 16/10*       (2006.01)
    *G11C 16/34*       (2006.01)
(58) Field of Classification Search
    USPC ............ 365/185.05, 189.09, 185.11, 185.12,
                365/185.18, 185.2, 185.33, 210.1, 185.17,
                                                365/185.23
    See application file for complete search history.

(56) References Cited

U.S. PATENT DOCUMENTS

| | | | |
|---|---|---|---|
| 8,942,046 B2* | 1/2015 | Kwak | G11C 16/10 |
| | | | 365/185.17 |
| 9,147,492 B2* | 9/2015 | Shim | G11C 16/10 |
| 9,257,185 B2* | 2/2016 | Park | G11C 16/10 |
| 2010/0172182 A1 | 7/2010 | Seol et al. | |
| 2012/0307561 A1* | 12/2012 | Joo | G11C 16/0483 |
| | | | 365/185.17 |
| 2013/0286747 A1 | 10/2013 | Kwak | |

* cited by examiner

SEMICONDUCTOR MEMORY DEVICE HAVING DUMMY WORD LINES AND OPERATING METHOD THEREOF

CROSS-REFERENCE TO RELATED APPLICATION

The present application claims priority to Korean patent application number 10-2015-0043627, filed on Mar. 27, 2015, the entire disclosure of which is herein incorporated by reference in its entirety.

BACKGROUND

Field of the Invention

Various embodiments of the present invention relate to an electronic device, and more particularly to a semiconductor memory device and a driving method thereof.

Description of the Related Art

Semiconductor disk devices are used instead of conventional hard disc drives (HDDs) that are slow, heavy, big and very noisy due to a rotating physical disc.

Semiconductor memory devices are embodied using semiconductors such as silicon (Si), Germanium (Ge), gallium arsenide (GaAs), indium phosphide (InP), etc. The semiconductor memory devices may be divided into volatile memory devices and nonvolatile memory devices.

The volatile memory devices may lose data stored therein if a power supply is blocked. The volatile memory devices include a Static RAM (SRAM), a Dynamic RAM (DRAM), a Synchronous DRAM (SDRAM), etc. The nonvolatile memory devices may retain data stored therein even when not powered. The nonvolatile memory devices include a Read Only Memory (ROM), Programmable ROM (PROM), an Electrically Programmable ROM (EPROM), an Electrically Erasable and a Programmable ROM (EEPROM), a flash memory, a Phase-change RAM (PRAM), a Magnetic RAM (MRAM), a Resistive RAM (RRAM), a Ferroelectric RAM (FRAM), etc. The flash memory may be a NOR type or a NAND type.

Recently, a research on a three-dimensional (3D) semiconductor memory device, in which cell strings are two-dimensionally arranged, is in progress to increase the degree of integration.

SUMMARY OF THE INVENTION

Various embodiments of the present invention are directed to a semiconductor memory device capable of reducing interference caused by an adjacent cell string while programming, and a driving method thereof.

A semiconductor memory device in accordance with one embodiment of the present invention may include a memory cell array which may include cell strings each of which has cells, extending in a first direction and arranged in a second direction and a third direction intersecting with the first direction; bit lines extending in the second direction and electrically coupled to sides of the cell strings; and word lines extending in the third direction intersecting with the second direction to be electrically coupled to a gate electrode of the memory cells. The word lines include dummy word lines, and a gate electrode of dummy cells in the memory cells is electrically coupled to the dummy word lines. A program voltage is supplied to a program word line electrically coupled to a gate electrode of a memory cell to be programmed, in the word lines. A voltage level supplied to a dummy word line disposed parallel to the program word line in the first direction (hereinafter referred to as "a parallel dummy word line") may be different from a voltage level supplied to a dummy word line except for the parallel dummy word line (hereinafter referred to as "a nonparallel dummy word line").

In accordance with an embodiment, the semiconductor memory device may further include a voltage generator for generating voltages supplied to the word lines, an address decoder for supplying one of voltages from the voltage generator to each of the word lines, and control logic for controlling the cell strings, the voltage generator and the address decoder. The voltages may include dummy word line voltages supplied to the dummy word lines and the program voltage, and the dummy word line voltages include a first dummy word line voltage and a second dummy word line voltage the level of which is different from the first dummy word line voltage. a first bit line voltage is supplied to a bit line electrically coupled to a cell string having the memory cell to be programmed (hereinafter referred to as "a program cell string"), and a second bit line voltage different from the first bit line voltage may be supplied to a bit line electrically coupled to a cell string except for the program cell string (hereinafter referred to as "a non-program cell string"). The address decoder may supply the first dummy word line voltage to the parallel dummy word line, and supply the second dummy word line voltage to the nonparallel dummy word line.

In accordance with an embodiment, the semiconductor memory device may further include an input-output interface for receiving a command and data from the external device and transmitting the command to the control logic, a data buffer for receiving the data from the input-output interface, and a page buffer for receiving the data from the data buffer, and the control logic receives or determines by itself an address in which the data will be stored within the memory cell array, from the input-output interface, and may transmit the address to the address decoder.

In accordance with an embodiment, a cell string parallel to the memory cell to be programmed in the third direction, to which the second bit line voltage is supplied from one of the bit lines (hereinafter, "a non-program cell string disposed parallel in the third direction") when the first dummy word line voltage is supplied to the parallel dummy word line may be lower than a level of a current flowing through the non-program cell string disposed parallel in the third direction when the second dummy word line voltage is supplied to the parallel dummy word line.

In accordance with an embodiment, a maximum value of an electric field applied to each cell included in a cell string including a dummy cell having a gate electrode electrically coupled to the nonparallel dummy word line (hereinafter referred to as "a non-program cell string disposed nonparallel in the third direction") when the second dummy word line voltage is supplied to the nonparallel dummy word line may be lower than a maximum value of an electric field applied to each cell included in the cell string disposed nonparallel in the third direction when the first dummy word line voltage is supplied to the nonparallel dummy word line.

In accordance with an embodiment, the control logic may transmit a voltage generator control signal to the voltage generator, and levels of the first dummy word line voltage and the second dummy word line voltage may be determined by a level of the voltage generator control signal.

A method of driving a semiconductor memory device in accordance with another embodiment of the present invention, the semiconductor memory device including a memory cell array including: cell strings each of which extends in a first direction and is arranged in a second direction and a third direction intersecting with the first direction; bit lines extending in the second direction and electrically coupled to sides of the cell strings; and word lines extending in the third direction intersecting with the second direction to be electrically coupled to a gate electrode of the cell strings, in which the word lines include dummy word lines, and a gate electrode of dummy cells included in the cell strings is electrically coupled to the dummy word lines, may include the steps of: determining levels of a first dummy word line voltage and a second dummy word line voltage; waiting a program command from the external device; and determining levels of voltages to be supplied to the word lines, in which levels of voltages supplied to each dummy word line may be determined according to the level of the first dummy word line voltage or the second dummy word line voltage.

In accordance with an embodiment, the step of determining the levels of the first dummy word line voltage and the second dummy word line voltage may include the steps of: measuring a parameter of the memory cell array, and determining an option on the basis of the measured parameter; and determining levels of a first dummy word line voltage and a second dummy word line voltage on the basis of the option.

In accordance with an embodiment, the step of determining the levels of the voltages to be supplied to the word lines may include the steps of: requesting an address of a program word line corresponding to a page containing a memory cell to be programmed; determining a voltage to be supplied to a dummy word line disposed parallel to the program word line in a first direction (hereinafter referred to as "a parallel dummy word line") as the first dummy word line voltage; and determining a voltage to be supplied to a dummy word line except for the parallel dummy word line (hereinafter referred to as "a nonparallel dummy word line") as the second dummy word line voltage.

In accordance with an embodiment, the method of driving the semiconductor memory device may further include a step of programming the memory cell array, in which the step of programming the memory cell array is able to be performed after the step of determining the levels of the voltages which will be supplied to the word lines.

BRIEF DESCRIPTION OF THE DRAWINGS

In accordance with an embodiment of the present invention, there is provided a semiconductor memory device and a driving method thereof, in which interference caused by an adjacent cell string is decreased while programming.

DETAILED DESCRIPTION

Hereinafter, preferred embodiments of the present invention will be described in detail with reference to the accompanying drawings. The same reference numerals provided throughout the specification substantially indicate the same members. In the following description, the detailed descriptions for well-known functions or constructions associated with the present invention are not described if they are considered to obscure the gist of the invention unnecessarily. Furthermore, as names of the members used in the following description may be chosen considering easiness in writing the specification, they may differ from names of components of an actual product.

Throughout this specification and the claims that follow, when it is described that an element is "coupled" to another element, the element may be "directly coupled" to the other element or "electrically coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

Figure 1:
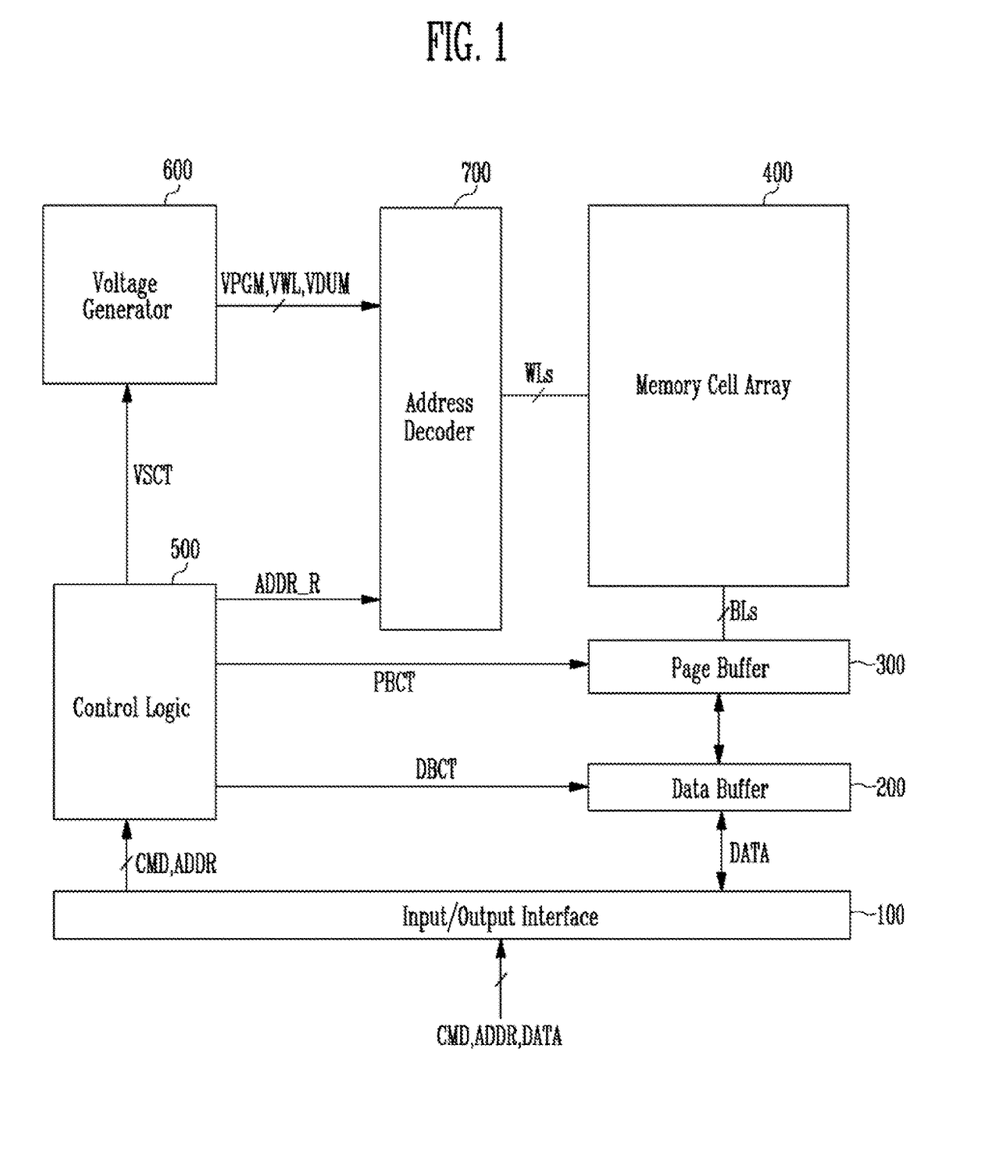
FIG. 1 is a block diagram illustrating a semiconductor memory device in accordance with an embodiment of the present invention.

FIG. 1 is a block diagram illustrating a semiconductor memory device in accordance with an embodiment of the present invention.

Referring to FIG. 1, the semiconductor memory device may include an input/output interface 100, a data buffer 200, a page buffer 300, a memory cell array 400, a control logic 500, a voltage generator 600 and an address decoder 700.

The input/output interface 100 receives data DATA and a command CMD (e.g., a program command) from the external device (not shown). The command CMD may be transmitted to the control logic 500, and data DATA may be transmitted to the data buffer 200. Furthermore, an address ADDR for a memory cell included in the memory cell array 400, which is to be programmed, may be received from the external device. The input/output interface 100 may include an I/O pad, etc.

The data buffer 200 stores the data DATA received from the input/output interface 100 in response to a data buffer control signal DBCT generated from the control logic 500.

The page buffer 300 receives and stores data, in response to the page buffer control signal PBCT generated from the control logic 500.

The memory cell array 400 includes a plurality of cell strings. The memory cell array 400 is coupled to the page buffer 300 through bit lines BLs and coupled to the address decoder 700 through word lines WLs. Data is programmed in the memory cell array 400. Drain selection lines associated with the memory cell array 400 is omitted, and a CAM cell (not shown) within the memory cell array 400 is omitted. Data stored in the CAM cell is not affected by a program command or an erase command received by the input/output interface 100.

When the control logic 500 receives the program command through the input/output interface 100, the data buffer control signal DBCT and the page buffer control signal PBCT are enabled sequentially. The control logic 500 generates a voltage generator control signal VSCT for the voltage generator 600. The control logic 500 transmits a row address ADDR_R to the address decoder 700. The control logic 500 may determine an address for a program operation based on an embedded algorithm, and transmits the determined row address ADDR_R to the address decoder 700.

The voltage generator 600 generates a program voltage VPGM, a word line voltage VWL and a dummy line voltage VDUM. The dummy line voltage VDUM includes a first dummy word line voltage and a second dummy word line voltage. The program voltage VPGM is supplied to a word line electrically coupled to a gate electrode of a memory cell to be programmed (hereafter, referred to as "a program word line"). The dummy word line voltage VDUM is supplied to dummy word lines. The word line voltage VWL is supplied to word lines that are not electrically coupled to the gate electrode of the memory cell to be programmed and are not dummy word lines (hereinafter, referred to as "non-program word lines"). The word line voltage VWL may have a first word line voltage and a second word line voltage. The first word line voltage may have a level different from the second word line voltage. Levels of the first dummy word line voltage and the second dummy word line voltage generated in the voltage generator 600 may be determined based on a level of the voltage generator control signal VSCT.

The address decoder 700 receives the row address ADDR_R from the control logic 500 and selects a page to be programmed from the memory cell array 400. Furthermore, one of the voltages VPGM, VWL and VDUM may be selected as a voltage to be supplied to each of the word lines, by the address decoder 700.

In a simulation or a process of an actual chip test of a semiconductor memory device, the levels of the first dummy word line voltage and the second dummy word line voltage may be determined. The determined levels of the first and second dummy word line voltages may be stored in the CAM cell. The control logic 500 may use the levels of the first and second dummy word line voltages stored in the CAM cell within the memory cell array 400. The control logic 500 may intactly use the levels of the first and second dummy word line voltages stored in the CAM cell. Moreover, the control logic 500 may measure a parameter associated with interference of the memory cell array 400, and change the levels of the first and second dummy word line voltages stored in the CAM cell based on the measured parameter.

Figure 2:
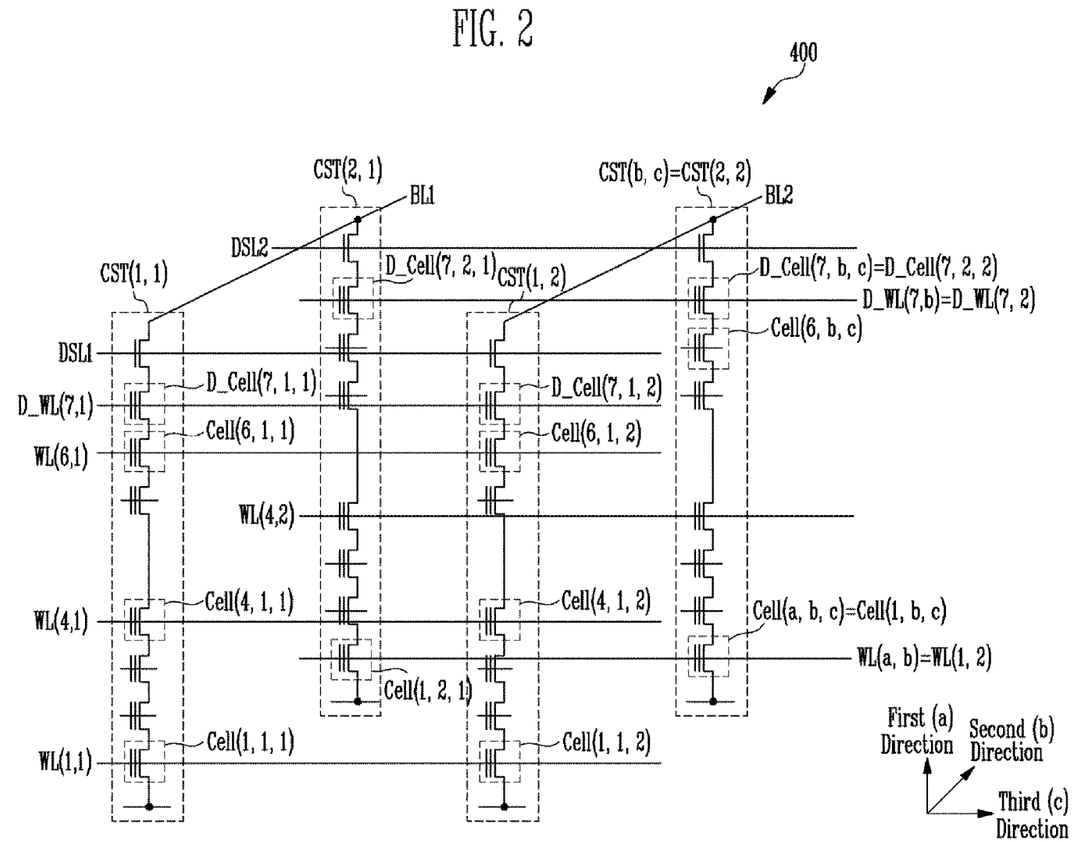
FIG. 2 is a detailed diagram of a memory cell array shown in FIG. 1.

FIG. 2 is a detailed view of the memory cell array 400 shown in FIG. 1.

With reference to FIG. 2, the memory cell array 400 includes cell strings CST(1, 1), CST(1, 2), CST(2, 1) and CST(2, 2), bit lines BL1 and BL2, word lines WL(1, 1) to WL(6, 2), dummy word lines D_WL(7,1) and D_WL(7,2) and drain selection lines DSL1 and DSL2. For the convenience of explanation, part of the whole memory cell array is illustrated in FIG. 2.

The cell strings CST(1, 1), CST(1, 2), CST(2, 1) and CST(2, 2) are arranged in a second direction and a third direction, each of the cell strings CST(1, 1), CST(1, 2), CST(2, 1) and CST(2, 2) are extended in a first direction. Herein, the first direction, the second direction and the third direction may intersect with one another. For a cell string CST(b, c), 'b' means an index (or an order) of the second direction, and 'c' means an index of the third direction, where b and c are natural numbers. The cell string CST(b, c) includes memory cells Cell(1, b, c) to Cell(6, b, c) and a dummy cell D_Cell(7, b, c) electrically coupled to each other in the first direction. For a memory cell Cell(a, b, c), 'a' means an index (or an order) of the first direction, 'b' means an index of the second direction, and 'c' means an index of the third direction, where, a, b and c are natural numbers. One or more bits may be stored in each of the memory cells Cell(a, b, c). The number of memory cells included in each of the cells strings and a location within the cell string of the dummy cell may be varied. For the convenience of explanation, hereinafter, it is assumed that a memory cell Cell(4, 1, 2) is selected to be programmed. A cell string CST(1, 2) including the memory cell Cell(4, 1, 2) may be defined as a selected cell string. If the memory cell to be programmed is the memory cell Cell(4, 1, 2), a word line WL(4, 1) becomes a selected word line, and other word lines WL(1, 1) to WL(3, 1), WL(5, 1) to WL(6, 1), and WL(1, 2) to WL(6, 2) become unselected word lines.

Bit lines BL1 and BL2 are extended in the second direction, and are coupled to the cell strings. A bit line BLc is coupled to one side of a cell string CST(b, c). If, for example, c is 1, the bit line BL1 is electrically coupled to cell strings CST(1, 1) and CST(2, 1). A first bit line voltage is supplied to the bit line BL2 electrically coupled to a selected cell string CST(1, 2) including the selected memory cell Cell(4, 1, 2), and a second bit line voltage different from the first bit line voltage is supplied to the bit line BL1 which are not electrically coupled thereto. For example, the first bit line voltage may be lower than the second bit line voltage. The bit lines BL illustrated in FIG. 1 include the bit lines BL1, BL2 illustrated in FIG. 2.

Word lines WL(1, 1) to WL(6, 2) and dummy word lines D_WL(7,1) and D_WL(7,2) extend in the third direction, and are electrically coupled to gate electrodes of memory cells Cell(1, 1, 1) to Cell(6, b, c) and gate electrodes of dummy cells D_Cell(7, 1, 1) to D_Cell(7, b, c). Each of the word lines WL(1, 1) to WL(6, 2) may correspond to each page within the memory cell array 400. Specifically, a word line WL(a, b) is electrically coupled to a gate electrode of a memory cell Cell(a, b, c). If, for example, 'a' and 'b' are 1, a word line WL(1, 1) is electrically coupled to gate electrodes of memory cells Cell(1, 1, 1) and Cell(1, 1, 2). The dummy word line D_WL(7, b) is electrically coupled to gate electrodes of dummy cells D_Cell(7, b, c). Specifically, the dummy word line D_WL(7, 1) is electrically coupled to gate electrodes of dummy cells Cell(7, 1, 1) and D_Cell(7, 1, 2), and the dummy word line D_WL(7, 2) is electrically coupled to gate electrodes of dummy cells D_Cell(7, 2, 1) and D_Cell(7, 2, 2). The word lines WLs illustrated in FIG. 1 include the word lines WL(1, 1) to WL(6, 2) and dummy word lines D_WL(7, 1) to D_WL(7, 2) illustrated in FIG. 2.

When the memory cell Cell(4, 1, 2) is selected to be programmed, the address decoder 700 supplies the program voltage VPGM to the selected word line WL(4, 1), supplies the first dummy word line voltage to the dummy word line D_WL(7, 1) electrically coupled to the selected cell string CST(1, 2), and supplies the second dummy word line voltage to the dummy word line D_WL(7, 2) which is not electrically coupled to the selected cell string CST(1, 2). Additionally, the address decoder 700 may supply the word line voltage VWL to the unselected word lines WL(1, 1) to WL(3, 1), WL(5, 1) to WL(6, 1), and WL(1, 2) to WL(6, 2).

The drain selection line DSL1 corresponds to cell strings CST(1, 1) and CST(1, 2), and the drain selection line DSL2 corresponds to cell strings CST(2, 1) and CST(2, 2).

When a three-dimension semiconductor is programmed, there is a point to be considered. In the process of programming the selected memory cell Cell(4, 1, 2), interference caused by unselected cell strings CST(1, 1), CST(2, 1), and CST(2, 2) has to be minimized. Specifically, when the memory cell Cell(4, 1, 2) is selected, it is preferable to minimize a current flowing through an unselected cell string CST(1, 1) next to the selected cell string CST(1, 2) in the third direction. It is also preferable to minimize a maximum value of an electric field applied to the dummy cells D_Cell(7, 2, 1) and D_Cell(7, 2, 2) included in unselected cell strings CST(2, 1) and CST(2, 2) next to the selected cell string CST(1, 2) in the second direction.

To minimize interference caused by unselected cell strings CST(1, 1), CST(2, 1), and CST(2, 2), it is advantageous that a level of a voltage supplied to the selected dummy word line D_WL(7, 1) is different from a level of a voltage supplied to the unselected dummy word line D_WL(7, 2). For the selected dummy word line D_WL(7, 1), it is preferable to decrease an amount of a current flowing through the dummy cell D_Cell(7, 1, 1) to minimize a current flowing through the unselected cell string CST(1, 1) disposed next to the selected cell string CST(1, 2) in the third direction. Therefore, the first dummy word line voltage should be low. However, a current flowing through the selected cell string CST(1, 2) has to be prevented from being excessively lowered by the dummy cell D_Cell(7, 1, 2) due to the excessively lowered first dummy word line voltage. A level of the first dummy word line voltage may be determined through a simulation or an actual chip test. The level of the first dummy word line voltage may be determined to minimize the amount of the current flowing through the unselected cell string CST(1, 1) next to the selected cell string CST(1, 2) in the third direction, while the current flowing through the selected cell string CST(1, 2) is not excessively lowered.

Meanwhile, for the unselected dummy word line D_WL (7, 2), it is advantageous to minimize a maximum value of the electric field applied to the dummy cells D_Cell(7, 2, 1) and D_Cell(7, 2, 2). A level of the second dummy word line voltage may be determined through a simulation or an actual chip test. The level of the second dummy word line voltage may be determined to minimize the maximum value of the electric field applied to the dummy cells D_Cell(7, 2, 1) and D_Cell(7, 2, 2).

The level of the first dummy word line voltage is determined by the voltage generator 600 to minimize the level of the current flowing through the unselected cell string CST(1, 1) next to the selected cell string CST(1, 2) in the third direction. Hence, the level of the current flowing through the unselected cell string CST(1, 1) next to the selected cell string CST(1, 2) in the third direction when the first dummy word line voltage is supplied to the selected dummy word line D_WL(7, 1) is lower than the level of the current flowing through the unselected cell string CST(1, 1) next to the selected cell string CST(1, 2) in the third direction when the first dummy word line voltage is supplied to the selected dummy word line D_WL(7, 1). However, the level of the second dummy word line voltage is determined by the voltage generator 600 to minimize the maximum value of the electric field applied to the dummy cells D_Cell(7, 2, 1) and D_Cell(7, 2, 2). Hence, a maximum value of an electric field applied to the dummy cells D_Cell(7, 2, 1) and D_Cell (7, 2, 2) when the second dummy word line voltage is supplied to the unselected dummy word line D_WL(7, 2) is lower than a maximum value of an electric field applied to the dummy cells D_Cell(7, 2, 1) and D_Cell(7, 2, 2) when the first dummy word line voltage is supplied to the unselected dummy word line D_WL(7, 2).

Figure 3:
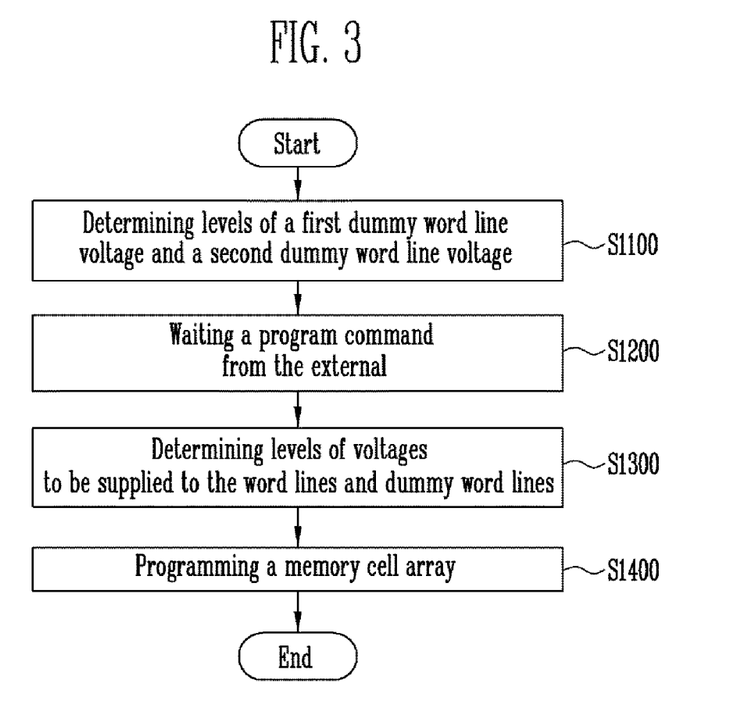
FIG. 3 is a flow chart for describing an operation of a semiconductor memory device shown in FIGS. 1 and 2.

FIG. 3 is a flow chart for describing an operation of the semiconductor memory device shown in FIGS. 1 and 2.

Referring to FIGS. 1 to 3, at step S1100, the levels of the first dummy word line voltage and the second dummy word line voltage are determined. If the levels of the first dummy word line voltage and the second dummy word line voltage are not changed, the step S1100 may be omitted for the next operations.

At step S1200, the control logic 500 waits for a program command to be received from the external device. When a command CMD is a program command, the command CMD is received to the control logic 500 via the input/output interface 100, and data DATA is received to the page buffer 300 via the input/output interface 100. The control logic 500 confirms that the program command was received. The control logic 500 receives, from the input/output interface 100, an address ADDR in which data is to be programmed. If there is not the address ADDR from the external device, the control logic 500 may determine the address ADDR internally. At step S1300, levels of voltages to be supplied to the word lines WL(1, 1) to WL(6, 2) and dummy word lines D_WL(7, 1) and D_WL(7, 2) are determined. The address decoder 700 chooses the level of the voltage to be supplied to each of the word lines WL(1, 1) to WL(6, 2) and the dummy word lines D_WL(7, 1) and D_WL(7, 2) as one of the program voltage VPGM, the word line voltage VWL and the dummy word line voltage VDUM based on a row address ADDR_R received from the control logic 500.

At step S1400 the memory cell array 400 is programmed according to the data stored in the page buffer 300 and the levels of the voltages to be supplied to each of the word lines WL(1, 1) to WL(6, 2) and the dummy word lines D_WL(7, 1) and D_WL(7, 2), which are determined in the step S1300.

Figure 5:
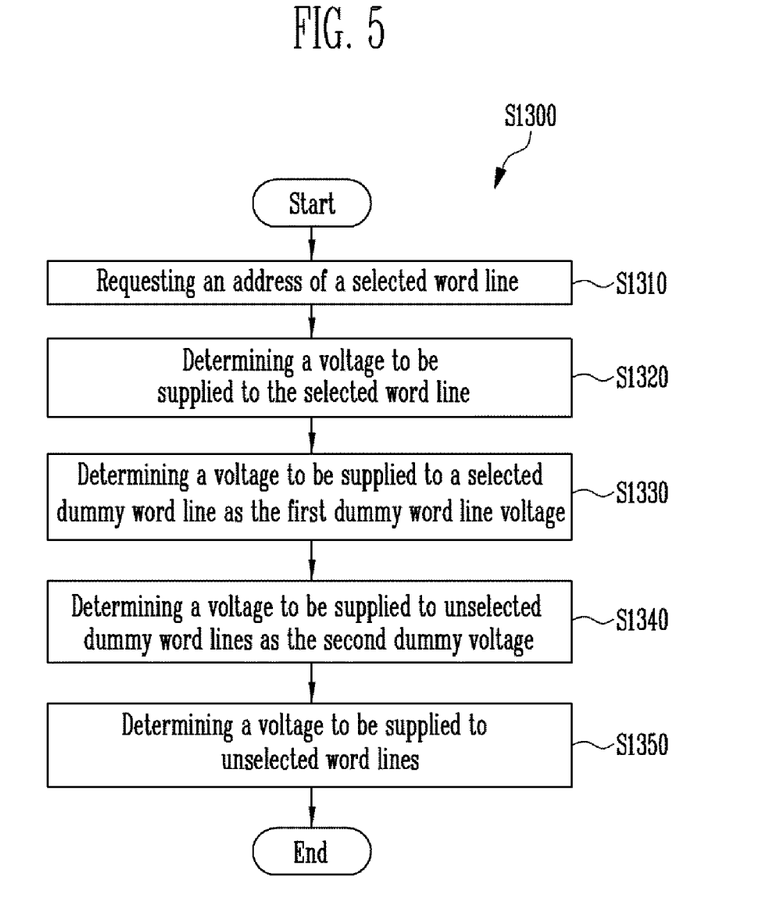

FIG. 5 is a detailed view of the step S1300 shown in FIG. 3.

Figure 4:
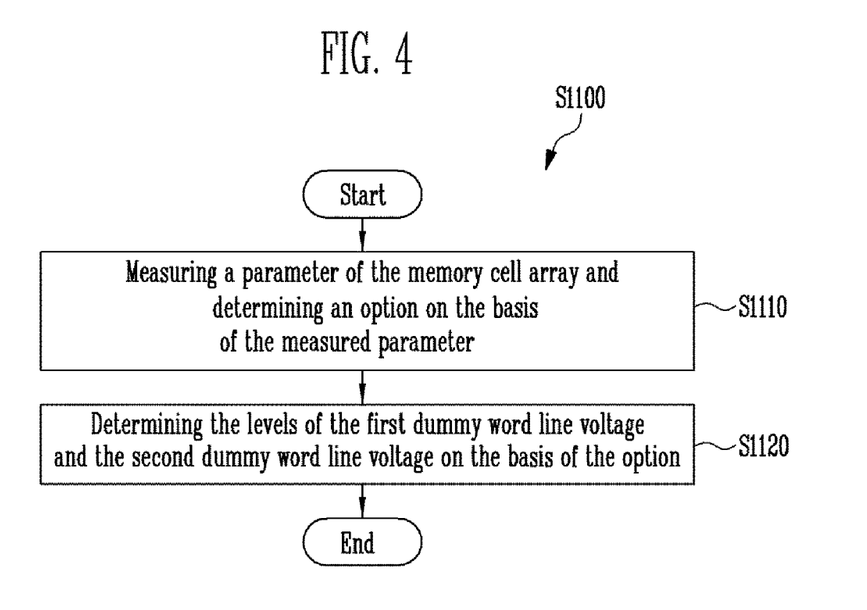
FIGS. 4 and 5 are detailed flow charts of steps shown in FIG. 3.

At step S1110, the parameter of the memory cell array 400 which is associated with interference is measured, and one of various options is determined based on the measured parameter. On the basis of the determined option, a level of the voltage generator control signal VSCT may be determined.

At step S1120, the levels of the first dummy word line voltage and the second dummy word line voltage are determined based on the option. The voltage generator 600 may determine the levels of the first dummy word line voltage and the second dummy word line voltage based on the level of the voltage generator control signal VSCT.

FIG. 5 is a detailed view of the step S1300 shown in FIG. 3.

At step S1310, the address decoder 700 requests the address ADDR. If the row address ADDR_R is received to the address decoder 700 in advance in the step S1200, the row address ADDR_R stored in the address decoder 700 may be used in the step S1310. Otherwise, at the step S1310, the address decoder 700 may request the control logic 500 for the row address ADDR_R, and in response to the request, the address ADDR from the control logic 500 may be received to the address decoder 700. After the step S1310, the address decoder 700 receives the row address ADDR_R corresponding to the selected word line WL(4, 1).

At step S1320 the voltage to be supplied to the selected word WL(4, 1) is determined as the program voltage VPGM. The program voltage VPGM may be supplied in a pulse form, and if it is supplied in the pulse form, a level and a width of the pulse may be changed.

At step S1330, a voltage to be supplied to the selected dummy word line D_WL(7, 1) is determined as the first dummy word line voltage.

At step S1340, the voltage to be supplied to the unselected dummy word line D_WL(7, 2) is determined as the second dummy word line voltage.

At step S1350 the voltage to be supplied to the unselected word lines WL(1, 1) to WL(3, 1), WL(5, 1) to WL(6, 1), and WL(1, 2) to WL(6, 2) are determined. The level of the supplied voltage may be changed based on the location relationship with the selected memory cell Cell(4, 1, 2).

As described above, according to the embodiments of the present invention, interference caused by an adjacent cell string while programming may be reduced.

The present invention has been described on the basis of the preferred embodiments, and embodiments having different forms from the detailed description of the present invention may be embodied within the essential technical scope of the present invention by a person having ordinary skill in the art to which the present invention pertains.

Herein, the essential technical scope of the present invention is reflected in the claims, and all differences within the scope equivalent thereto should be interpreted to be included in the present invention.

What is claimed is:

1. A semiconductor memory device comprising:
   a memory cell array; and
   a voltage generator suitable for generating voltages supplied to the memory cell array,
   wherein the memory cell array comprises:
      cell strings each including a dummy cell and memory cells extending in a first direction and arranged in a second direction and a third direction intersecting with the first direction;
      bit lines extending in the second direction and electrically coupled to the cell strings;
      word lines extending in the third direction intersecting with the second direction and electrically coupled to corresponding memory cells; and
      dummy word lines extending in the third direction and electrically coupled to corresponding dummy cells,
   wherein a program voltage is supplied to a selected word line that is electrically coupled to a selected memory cell included in a selected cell string, and
   wherein a first dummy word line voltage is supplied to a selected dummy word line that is electrically coupled to a dummy cell included in the selected cell string, a second dummy word line voltage is supplied to an unselected dummy word line that is electrically coupled to a dummy cell included in an unselected cell string, and a level of the second dummy word line voltage is different from a level of the first dummy word line voltage.

2. The semiconductor memory device according to claim 1, further comprising:
   an address decoder suitable for supplying one of the voltages generated from the voltage generator to each of the word lines; and
      a control logic suitable for controlling the cell strings, the voltage generator and the address decoder,
   wherein the voltages includes the first dummy word line voltage, the second dummy word line voltage and the program voltage, and
   wherein a first bit line voltage is supplied to a bit line electrically coupled to the selected cell string, and a second bit line voltage different from the first bit line voltage is supplied to a bit line electrically coupled to the unselected cell string.

3. The semiconductor memory device according to claim 2, further comprising:
   an input/output interface suitable for receiving a command and data and transmitting the command to the control logic;
   a data buffer suitable for receiving the data from the input/output interface; and
   a page buffer suitable for receiving the data from the data buffer,
   wherein the control logic receives an address in which the data is to be stored from the input/output interface or determines the address internally, and transmits the address to the address decoder.

4. The semiconductor memory device according to claim 2, wherein the selected dummy word line is electrically coupled to the selected cell string and a first unselected cell string next to the selected string in the third direction and the first unselected cell string is supplied with the second bit line voltage from one of the bit lines,
   wherein a first current flows through the first unselected cell string when the first dummy word line voltage is supplied to the selected dummy word line and a second current flows through the first unselected cell string when the second dummy word line voltage is supplied to the selected dummy word line, and
   wherein a level of the first current is lower than a level of the second current.

5. The semiconductor memory device according to claim 2, wherein the unselected dummy word line is electrically coupled to a second unselected cell string next to the selected string in the second direction,
   wherein a first electric field is applied to each memory cell included in the second unselected cell string when the second dummy word line voltage is supplied to the unselected dummy word line, and a second electric field is applied to each memory cell included in the second unselected cell string when the first dummy word line voltage is supplied to the unselected dummy word line, and
   wherein a maximum value of the first electric field is lower than a maximum value of the second electric field.

6. The semiconductor memory device according to claim 2, wherein the control logic generates a voltage generator control signal, and levels of the first dummy word line voltage and the second dummy word line voltage are determined by a level of the voltage generator control signal.

7. The semiconductor memory device according to claim 2, wherein the first bit line voltage is lower than the second bit line voltage.

8. A method of driving a semiconductor memory device, the semiconductor memory device with a memory cell array that includes cell strings extending in a first direction and arranged in a second direction and a third direction intersecting with the first direction, the method comprising:
   determining levels of a first dummy word line voltage and a second dummy word line voltage;
   waiting for a program command to be received from an external; and
   determining levels of voltages to be supplied to word lines and dummy word lines included in the memory cell array,
   wherein the first dummy word line voltage is supplied to a selected dummy word line corresponding to a selected cell string among the cell strings, a second dummy word line voltage is supplied to unselected dummy word lines corresponding to unselected cell strings among the cell strings, and a level of the second dummy word line voltage is different from a level of the first dummy word line voltage.

9. The method according to claim 8, wherein the memory cell array further comprises:
   bit lines extending in the second direction and electrically coupled to the cell strings;
   the word lines extending in the third direction intersecting with the second direction and electrically coupled to corresponding memory cells; and
   the dummy word lines extending in the third direction and electrically coupled to corresponding dummy cells.

10. The method according to claim 9, wherein the determining of the levels of the first dummy word line voltage and the second dummy word line voltage comprises:
   measuring a parameter of the memory cell array to determine an option based on the measured parameter; and determining the levels of the first dummy word line voltage and the second dummy word line voltage based on the option.

11. The method according to claim 9, further comprising:
after the determining the levels of the voltages to be supplied to the word lines, programming the memory cell array.

12. The method according to claim 8, wherein the determining the levels of the first dummy word line voltage and the second dummy word line voltage comprises:
requesting an address of a selected word line corresponding to a page containing a memory cell to be programmed;
determining a voltage to be supplied to the selected dummy word line as the first dummy word line voltage, wherein the selected dummy word line is electrically coupled to a dummy cell included in the selected cell string; and
determining a voltage to be supplied to unselected dummy word line as the second dummy word line voltage, wherein the unselected dummy word lines are electrically coupled to dummy cells included in the unselected cell strings.

\* \* \* \* \*